United States Patent
Roberts et al.

(10) Patent No.: US 7,629,680 B2
(45) Date of Patent: Dec. 8, 2009

(54) DIRECT POWER DELIVERY INTO AN ELECTRONIC PACKAGE

(75) Inventors: Brent M. Roberts, Phoenix, AZ (US); Sriram Srinivasan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 470 days.

(21) Appl. No.: 11/387,512

(22) Filed: Mar. 22, 2006

(65) Prior Publication Data

US 2007/0222059 A1    Sep. 27, 2007

(51) Int. Cl.
*H01L 23/52* (2006.01)
(52) U.S. Cl. ..................................................... 257/691
(58) Field of Classification Search ................ 257/691
See application file for complete search history.

(56) References Cited

U.S. PATENT DOCUMENTS

| 5,612,254 | A | 3/1997 | Mu et al. | |
|---|---|---|---|---|
| 6,313,493 | B1 * | 11/2001 | Mori et al. | 257/296 |
| 2005/0133901 | A1 * | 6/2005 | Edwards et al. | 257/691 |
| 2005/0146017 | A1 * | 7/2005 | Koide | 257/698 |
| 2005/0276029 | A1 | 12/2005 | Lober | |

* cited by examiner

*Primary Examiner*—Trung Dang
(74) *Attorney, Agent, or Firm*—David L. Guglielmi

(57) ABSTRACT

In some embodiments, direct power delivery into an electronic package is presented. In this regard, a substrate is introduced having a conductive substrate core designed to physically connect with a power cable. Other embodiments are also disclosed and claimed.

10 Claims, 2 Drawing Sheets

DIRECT POWER DELIVERY INTO AN ELECTRONIC PACKAGE

FIELD OF THE INVENTION

Embodiments of the present invention generally relate to the field of integrated circuit packages, and, more particularly to direct power delivery into an electronic package.

BACKGROUND OF THE INVENTION

FIG. 1 is a graphical illustration of a cross-sectional view of an implementation of a conventional electronic package. As shown system 100 includes a motherboard 102 that includes a power source 104 that provides a constant voltage, for example a device operating voltage or higher. For higher voltage, a voltage regulation (VR) circuitry 114 is provided on the package 110. This power is routed through route 106 within motherboard 102 to underneath socket 108. The power is routed through contacts in socket 108 to pads on device package 110. Within device package 110 the power is routed to voltage regulation (VR) circuitry 114 where the power is converted to the operating voltage (typically <2V) of die 112. This regulated operating voltage is routed back through device package 110 to die 112. With the increase in complexity and decrease in feature sizes of integrated circuit components, it is becoming more difficult to route all the necessary input/output (I/O) and power to the die.

BRIEF DESCRIPTION OF THE DRAWINGS

The present invention is illustrated by way of example and not limitation in the figures of the accompanying drawings in which like references indicate similar elements, and in which.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
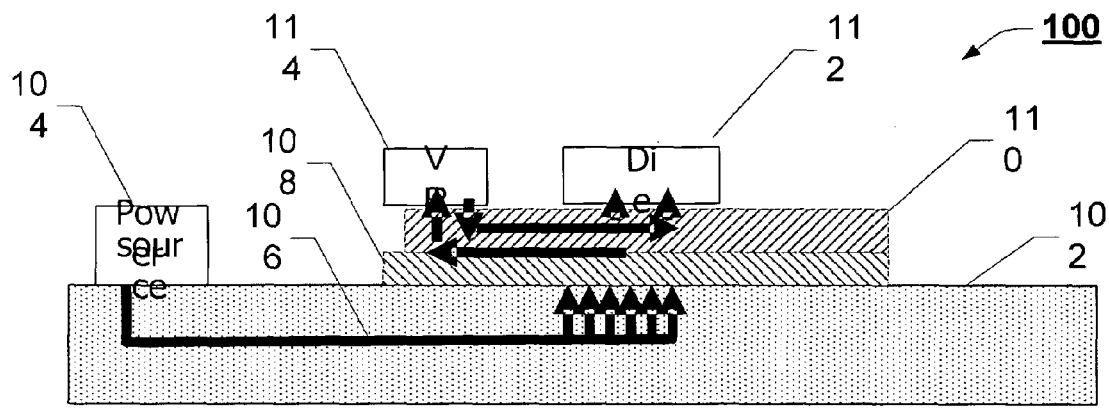
FIG. 1 is a graphical illustration of a cross-sectional view of an implementation of a conventional electronic package.
Figure 2:
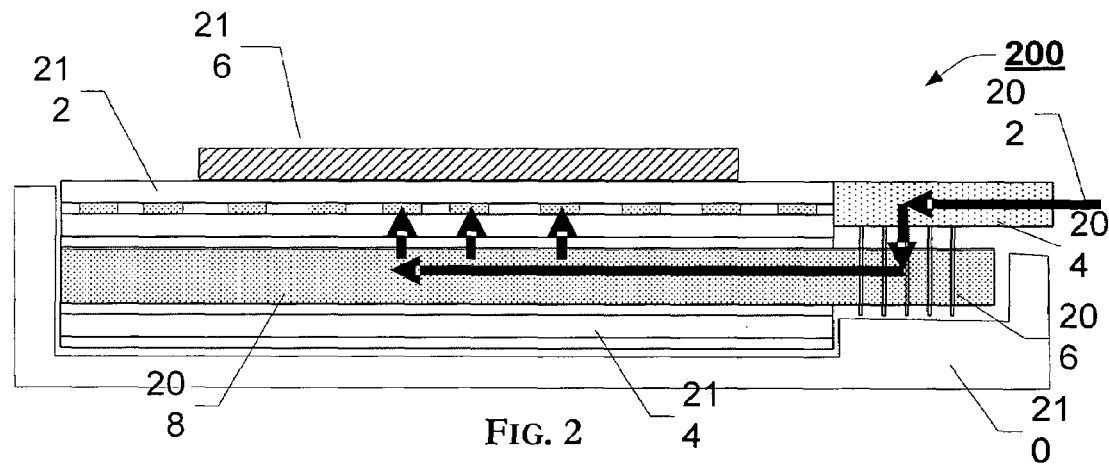
FIG. 2 is a graphical illustration of a cross-sectional view of an implementation of an electronic package, in accordance with one example embodiment of the invention.

FIG. 2 is a graphical illustration of a cross-sectional view of an implementation of an electronic package, in accordance with one example embodiment of the invention. In accordance with the illustrated example embodiment, package implementation 200 includes power cable 202, interposer 204, connector 206, substrate core 208, socket 210, build-up layers 212/214, and die 216.

Power cable 202 represents an insulated cable that carries power from a power source within a system. Power cable 202 may include multiple voltage wires and a ground wire. In one embodiment, the power comes from VR circuitry (not shown) that provides an operating voltage for die 216. In another embodiment, power cable 202 transmits unregulated power, and the VR circuitry to provide the operating voltage for die 216 is located on interposer 204 or on substrate core 208.

Interposer 204 interfaces power cable 202 with substrate core 208 through connector 206. Interposer may comprise a circuit board with VR or other circuitry.

Connector 206 represents a connection to transmit power from interposer 204 to substrate core 208. In one embodiment, connector 206 comprises pins from interposer 204 coupling with holes in an extended region of substrate core 208. Other embodiments may utilize other known types of connectors.

Substrate core 208 represents a core that may be made of a metal such as copper. Substrate core 208 may be laminated with dielectric material as part of a substrate build-up and may have insulated traces routed through it. Electrically isolated regions of substrate core 208 may be used to transmit power that is delivered to traces that connect with die 216.

Socket 210 provides mechanical support to an electronic package. In one embodiment, socket 210 is soldered to a motherboard and contains contacts to route input/output (I/O) signals from the motherboard to die 216. To the extent power is delivered to die 216 through power cable 202, socket 210 need not include contacts to route power.

Build-up layers 212/214 contain conductive traces and features and dielectric material that are built upon substrate core 208. Current at the operating voltage would be routed from substrate core 208 through build-up layers 212 to die 216. Additionally, I/O signals from socket 210 would be routed through build-up layers 212/214 to die 216.

Signal and conductive traces may be routed within and through-holes may be routed through signal routing layers 212/214 and pads may be included to couple with socket contacts. These conductive traces would route I/O signals from socket 210 through substrate core 208 to die 216.

Die 216 may represent any integrated circuit device. In one embodiment, die 216 is a microprocessor or processor.

Figure 3:
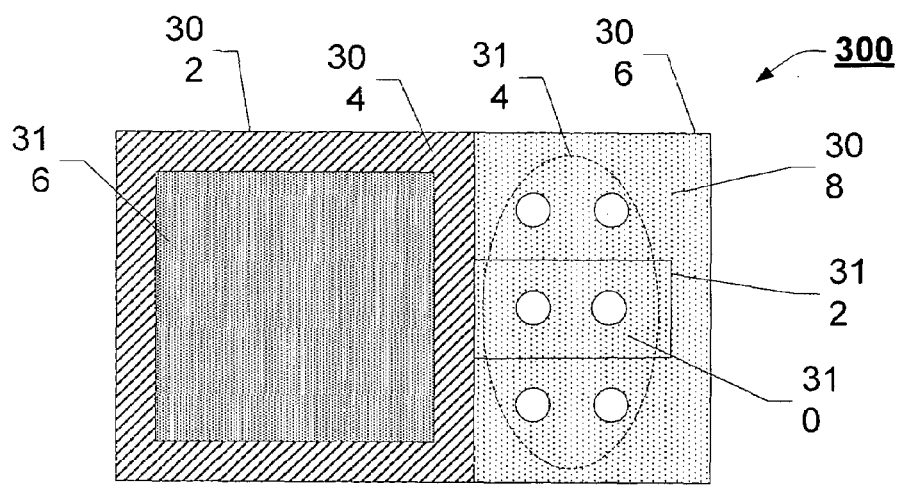
FIG. 3 is a graphical illustration of an overhead view of an electronic package, in accordance with one example embodiment of the invention.

FIG. 3 is a graphical illustration of an overhead view of an electronic package, in accordance with one example embodiment of the invention. As shown, electronic package 300 includes substrate 302, build-up area 304, extended substrate core area 306, first electrically isolated region 308, second electrically isolated region 310, insulating barrier 312, holes 314, and die 316.

Substrate 302, which is coupled with die 316, includes a substrate core which is built-up in one region and not built-up in another region. Build-up area 304 includes trace and feature routing and corresponds to build-up layers 212/214. The area of substrate core not built-up, extended substrate core area 306, provides a flange with which to couple with a power cable.

In order to store and route electric charge, extended substrate core area 306 may include first electrically isolated region 308 and second electrically isolated region 310 separated by insulating barrier 312. While shown as including two electrically isolated regions, extended substrate core area 306 may include any number of electrically isolated regions. Insulating barrier 312 may comprise an epoxy or other dielectric material that was built into the substrate core. In another embodiment, extended substrate core area 306 comprises multiple conductive layers laminated together instead of one solid metal core. In this case, each conductive layer of the core substrate would be electrically isolated from each other and could store distinct voltages.

Holes 314 provide the female connection to mate with pins from a power cable or interposer 204. The holes located within first electrically isolated region 308 may couple with pins that provide a different voltage than the pins that couple with the holes in second electrically isolated region 310. In this way, electronic package 300 may be able to receive and transmit multiple voltages from a power cable.

Figure 4:
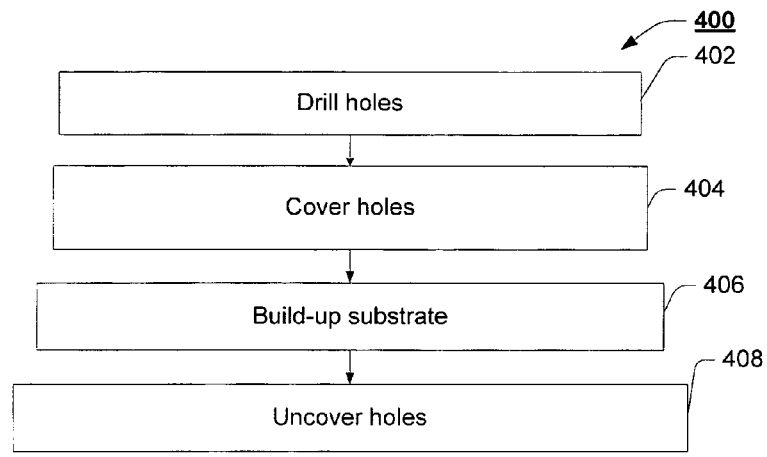
FIG. 4 is a flow chart of an example method for fabricating an electronic package, in accordance with one example embodiment of the invention.

FIG. 4 is a flow chart of an example method for fabricating an electronic package, in accordance with one example embodiment of the invention. It will be readily apparent to those of ordinary skill in the art that although the following operations may be described as a sequential process, many of the operations may in fact be performed in parallel or concurrently. In addition, the order of the operations may be re-arranged or steps may be repeated without departing from the spirit of embodiments of the invention.

According to but one example implementation, the method of FIG. 4 begins with drilling (402) holes (314) in a reserved area of the substrate core (306).

Next, a mask is applied to cover (404) the holes to prevent them from getting filled by subsequent processing.

Build-up (406) of the substrate then occurs with trace and route features being contained to less than the entire area (304) of the substrate core.

Lastly, the holes are uncovered (408), removing the mask and any build-up material in extended substrate core area 306, thereby leaving a flange to couple with an interposer or power cable. Additional steps may be needed to complete the substrate and to couple the substrate with an integrated circuit die.

Figure 5:
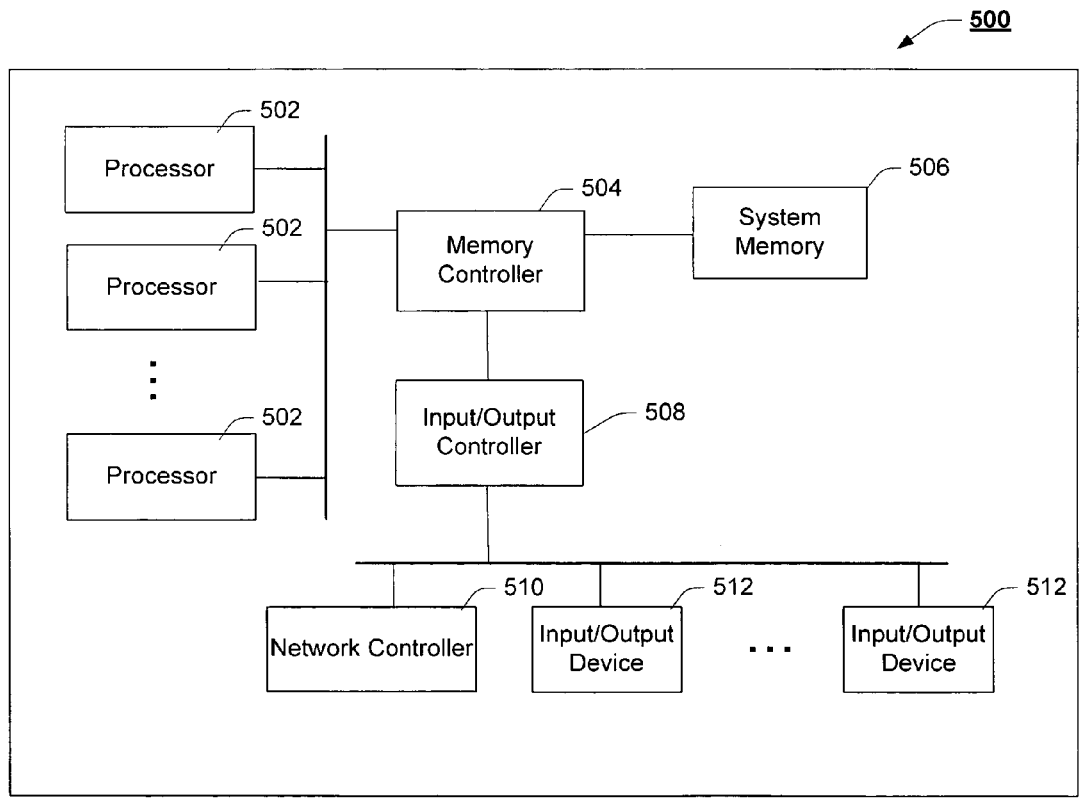
FIG. 5 is a block diagram of an example electronic appliance suitable for implementing an electronic package, in accordance with one example embodiment of the invention.

FIG. 5 is a block diagram of an example electronic appliance suitable for implementing an electronic package, in accordance with one example embodiment of the invention. Electronic appliance 500 is intended to represent any of a wide variety of traditional and non-traditional electronic appliances, laptops, desktops, cell phones, wireless communication subscriber units, wireless communication telephony infrastructure elements, personal digital assistants, set-top boxes, or any electric appliance that would benefit from the teachings of the present invention. In accordance with the illustrated example embodiment, electronic appliance 500 may include one or more of processor(s) 502, memory controller 504, system memory 506, input/output controller 508, network controller 510, and input/output device(s) 512 coupled as shown in FIG. 5. Processor(s) 502, or other integrated circuit components of electronic appliance 500, may be housed in a package including a substrate described previously as an embodiment of the present invention.

Processor(s) 502 may represent any of a wide variety of control logic including, but not limited to one or more of a microprocessor, a programmable logic device (PLD), programmable logic array (PLA), application specific integrated circuit (ASIC), a microcontroller, and the like, although the present invention is not limited in this respect. In one embodiment, processors(s) 502 are Intel® compatible processors. Processor(s) 502 may have an instruction set containing a plurality of machine level instructions that may be invoked, for example by an application or operating system.

Memory controller 504 may represent any type of chipset or control logic that interfaces system memory 508 with the other components of electronic appliance 500. In one embodiment, the connection between processor(s) 502 and memory controller 504 may be referred to as a front-side bus. In another embodiment, memory controller 504 may be referred to as a north bridge.

System memory 506 may represent any type of memory device(s) used to store data and instructions that may have been or will be used by processor(s) 502. Typically, though the invention is not limited in this respect, system memory 506 will consist of dynamic random access memory (DRAM). In one embodiment, system memory 506 may consist of Rambus DRAM (RDRAM). In another embodiment, system memory 506 may consist of double data rate synchronous DRAM (DDRSDRAM).

Input/output (I/O) controller 508 may represent any type of chipset or control logic that interfaces I/O device(s) 512 with the other components of electronic appliance 500. In one embodiment, I/O controller 508 may be referred to as a south bridge. In another embodiment, I/O controller 508 may comply with the Peripheral Component Interconnect (PCI) Express™ Base Specification, Revision 1.0a, PCI Special Interest Group, released Apr. 15, 2003.

Network controller 510 may represent any type of device that allows electronic appliance 500 to communicate with other electronic appliances or devices. In one embodiment, network controller 510 may comply with a The Institute of Electrical and Electronics Engineers, Inc. (IEEE) 802.11b standard (approved Sep. 16, 1999, supplement to ANSI/IEEE Std 802.11, 1999 Edition). In another embodiment, network controller 510 may be an Ethernet network interface card.

Input/output (I/O) device(s) 512 may represent any type of device, peripheral or component that provides input to or processes output from electronic appliance 500.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. An apparatus comprising:
   an integrated circuit die; and
   a substrate, including one or more female connectors formed in a flange of the substrate to accommodate one or more pins from a power cable.

2. The apparatus of claim 1, further comprising an extension of a core of the substrate to house the connector.

3. The apparatus of claim 2, wherein the connector comprises holes in the substrate core, the substrate core being a solid conductive metal or a laminated core with multiple conducting layers.

4. The apparatus of claim 2, further comprising pads to couple with socket contacts, the pads corresponding to input/output (I/O) signals and not power delivery.

5. An electronic appliance comprising:
- a network controller;
- a system memory; and
- a processor, wherein the processor includes a substrate, including one or more female connectors formed in a flange of the substrate core to accommodate one or more pins from the power cable.

6. The electronic appliance of claim 5, further comprising voltage regulation circuitry to provide regulated power coupled with the substrate through a power delivery cable.

7. The electronic appliance of claim 6, wherein the voltage regulation circuitry is located on a separate circuit board.

8. The electronic appliance of claim 5, wherein the connector is built in a flange of a conductive substrate core.

9. The electronic appliance of claim 5, further comprising a socket to house the processor, the socket containing contacts to provide input/output (I/O) signals to the processor but not containing contacts to provide operating voltage.

10. The electronic appliance of claim 5, wherein the substrate comprises voltage regulation circuitry.

\* \* \* \* \*

UNITED STATES PATENT AND TRADEMARK OFFICE
CERTIFICATE OF CORRECTION

PATENT NO.       : 7,629,680 B2
APPLICATION NO.  : 11/387512
DATED            : December 8, 2009
INVENTOR(S)      : Roberts et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 731 days.

Signed and Sealed this

Twenty-first Day of December, 2010

David J. Kappos
*Director of the United States Patent and Trademark Office*